United States Patent [19]

Altimier, Jr. et al.

[11] Patent Number: 4,985,917
[45] Date of Patent: Jan. 15, 1991

[54] PERSONAL ARTIFICIAL LOOP (P.A.L.)

[76] Inventors: David F. Altimier, Jr.; B. J. McIntosh, both of A&M Technology Box 818, Waterford, Pa. 16441

[21] Appl. No.: 394,817

[22] Filed: Aug. 17, 1989

[51] Int. Cl.$^5$ .............................................. H04M 3/24
[52] U.S. Cl. ......................................... 379/32; 379/21; 330/2
[58] Field of Search ..................... 379/21, 4, 32, 34, 1, 379/5; 330/2

[56] References Cited

U.S. PATENT DOCUMENTS 4,862,491 8/1989 LaSalle et al. ..................... 379/21

OTHER PUBLICATIONS

Technical–Photophone Test Equipment, RCA Manufacturing Co., Issue 1, No. 2C5-6, 5-4-39, 8 pages.

Primary Examiner—Stafford D. Schreyer
Attorney, Agent, or Firm—Charles L. Lovercheck; Wayne L. Lovercheck; Dale Lovercheck

[57] ABSTRACT

Apparatus used for local simulation of a metallic pair of 22 Gauge conductors, such as comprising a telephone line, 6.5 miles in length at 70 degrees Fahrenheit consisting of a resistance network. This apparatus is useful for fault identification of telephone line amplifiers, allowing for local activation when used in conjunction with milliampere test meters, in lieu of a technician's required travel to a minimum of 6 miles to perform the same task. This apparatus is useful in that it allows for function testing of typical line amplifiers at the source of the metallic pair.

7 Claims, 2 Drawing Sheets

PERSONAL ARTIFICIAL LOOP (P.A.L.)

BACKGROUND OF THE INVENTION

1. Field of the Invention

This invention relates to the ability to simulate a metallic pair of conductors, such as used on telephone and other communication lines, as to provide a resistive value necessary to activate line amplifiers attached to said metallic pairs.

2. Description of the Prior Art

One of the common types of metallic pair communication problems is lack of sufficient underlying electrical current to provide adequate customer service in the communications industry. This is because as the length of metallic pairs increases so does its resistance to current flow. The method of restoring the minimum underlying current necessary for adequate communication service is to attach a line current amplifier at the source of the metallic pair. This line amplifier attached in series with the metallic pair at its source is activated when it senses a minimum resistance short across the pair such as that generated by a telephone instrument's hand set being lifted a distance away from the source of the metallic pair.

When insufficient current on the amplified metallic pair is detected, a technician must travel away from the source of the metallic pair, commonly known as a Telephone Exchange, to a distance necessary to activate the turn on feature of the line amplifier. Usually, this is 32,260 feet of 22 gauge metallic pair wires away from the source, Exchange, which is equivalent to approximately 1000 OHMS of resistance measured at 70 degrees Fahrenheit, this being the minimum resistance necessary on the metallic pairs to activate a line amplifier. If the technician determines no underlying current increase is present on the metallic pair at the distance, he must return to the source, Exchange, and put a new line amplifier in series with the suspect metallic pair in place of the faulty unit. After this is accomplished, the technician must travel once more to the minimum distance location to test for the line amplifier's operation. Clearly, this operation of adding, changing, metallic pair line amplifiers can be time consuming and costly due to the necessary travel between the source and the resistive distance necessary to activate the amplifier.

The metallic telephone pair of wires is tested by a technician at the distant end or at an intermediate point of minimum resistance value length required, by inserting a telephone test set or a standard milliampere meter across the pair and taking a measurement reading. He then compares this reading against his company's acceptable value. Having done this, the technician determines if the current reading is acceptable or not which at this point, if not, he must return to the intermediate minimum resistance points to find where the current is lost up to and including the source, Exchange. This is the present procedure for fault locating which is both time consuming and costly. At times, this is minimized when another technician is at the source to work with the outside technician. More often, with the change in technology, exchanges are not manned and therefore the technician must travel back and forth repeatedly to fault locate.

BRIEF SUMMARY OF THE INVENTION

It is the purpose of the invention to provide a method of testing metallic pair amplification provided by a electronic current generating unit placed in series with the pair at the source, telephone Exchange. This series connection is done at the Exchange source by means of a cross-connect wiring block located on the Main Distribution Frame which distributes outside metallic pairs in such a manner as to allow individual equipment attachment to them. Thus, local activation of metallic pair amplifiers are accomplished, in lieu of traveling 6 miles from the source to obtain the same result.

BRIEF DESCRIPTION OF THE DRAWINGS

FIG. 6 is the method diagram of the apparatus testing in the second amplifier activated mode.

DETAIL DESCRIPTION FOR UTILIZING APPARATUS

Figure 1:
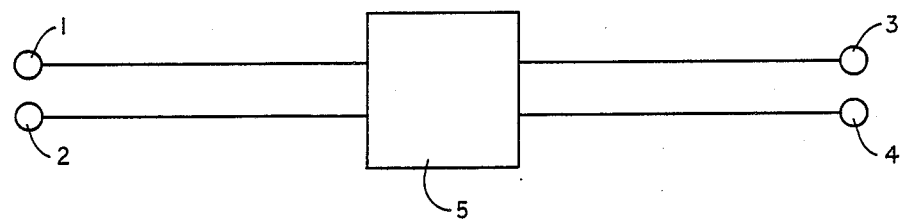
FIG. 1 is a block diagram of the simulating apparatus of FIG. 6.
Figure 2:
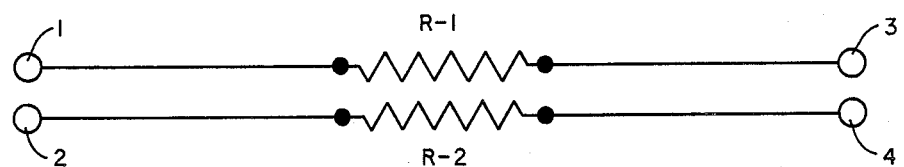
FIG. 2 is an electronic representation of the simulation unit's duplication of the physical 6.5 miles of 22 gauge communication lines with R1 and R2 equal to 600 ohms each, as referenced in FIG. 3. reference 13.
Figure 3:
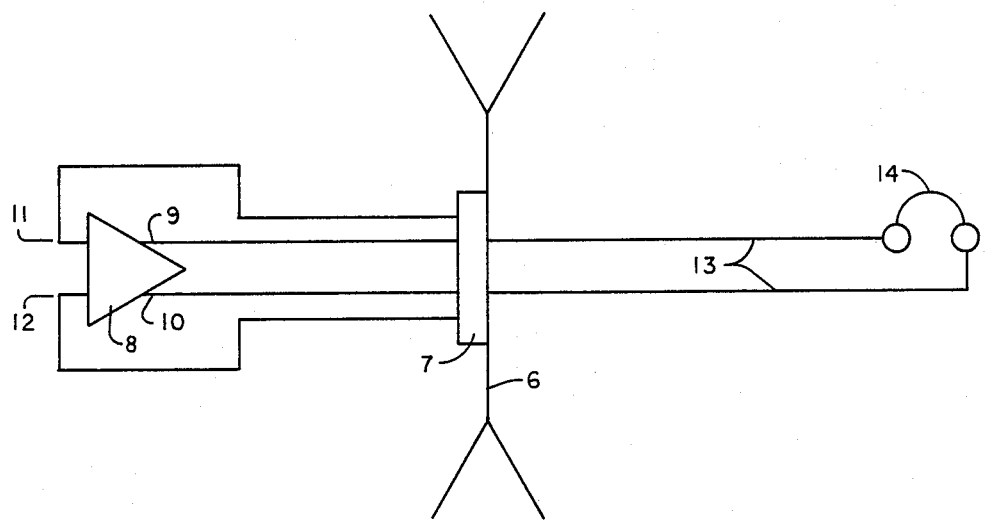
FIG. 3 is a Block diagram of selected line amplifier cabled to a main distribution frame cross connect block connecting metallic pair to customer equipment.
Figure 4:
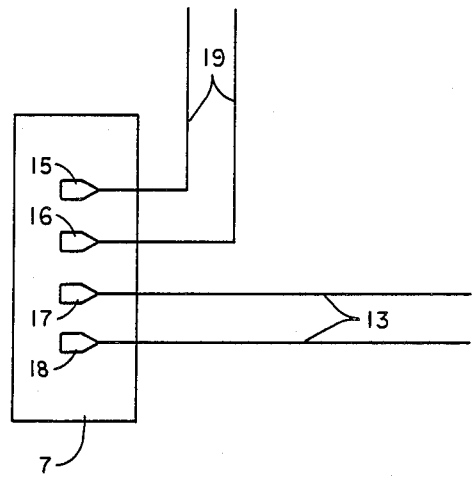
FIG. 4 is a block diagram of a cross connect block highlighting one of several input and output pins for a selected line amplifier.
Figure 6:
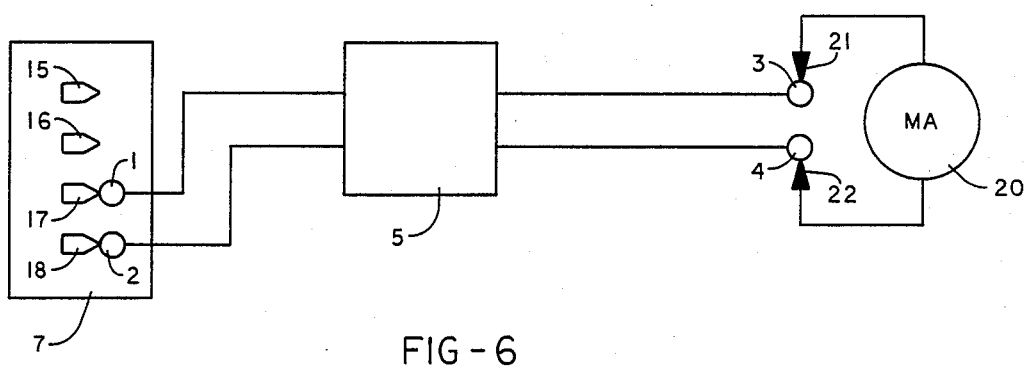
FIG. 6 is a situation diagram simulating a metallic pair communication line with the apparatus placed in position to activate the line amplifier.

Apparatus, FIG. 1, can be attached in series, FIG. 6, with the line amplifier at the cross-connect wiring block FIG. 4, located on the source Main Distribution Frame, FIG. 3, unit 6. The cross-connect wiring block FIG. 4, consists of 2 input pins, 15/16, attaching originating central office equipment, FIG. 4 reference 19, and 2 output pins, 17/18, of selected line amplifier to outside metallic pair FIG. 4 ref. 13, and telephone subscriber FIG. 3, ref. 14. The selected line amplifier, FIG. 3 unit 8 and its 2 input 11/12 and 2 output 09/10 leads, are physically connected to the Main distribution frame, FIG. 3 unit 6, cross connect block FIG. 3 unit 7 in the following manner:

(a) Typical line amplifier, FIG. 3 unit 8, is located in a miscellaneous equipment by a in a telephone office and is cabled to the main distribution frame, item 6. The amplifier is hard-wired to the main distribution frame cross connect block, unit 7, in the following pin connect reference:

1. Amplifier input, FIG. 3 leads 11 and 12 cabled to cross connect block FIG. 4 unit 7 pins 15 and 16.

2. Amplifier output, FIG. 3 leads 9 and 10 are cabled to cross connect block FIG. 4 pins 17 and 18.

Figure 5:
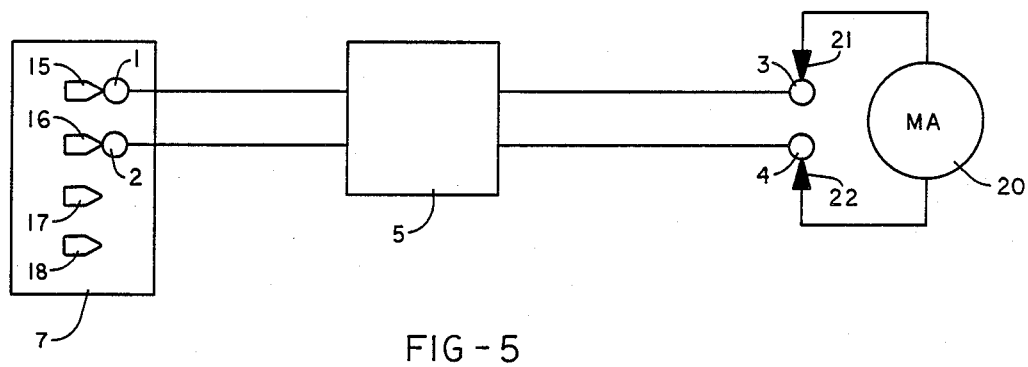
FIG. 5 is the method diagram of the apparatus testing in the first non amplified reference mode.

Appartus is connected int he following manner:

(a) Connect apparatus FIG. 5 unit 5 leads 1 and 2 to cross connect input pins 15 and 16 of pre selected amplifier. FIG. 3 unit 18. Connect remaining apparatus leads 3 and 4 FIG. 5 to a suitable test meter FIG. 5 unit 20 leads 21 and 22 with muilliampere test capabilities. This produces a non-amplifier activated amp reading for reference purposes against the next step.

(b) Connect apparatus FIG. 6, unit 5 leads 1 and 2 to cross connect output pins, 17/18, of pre selected amplifier FIG. 3 unit 8. now in series with the line amplifier triggering its activation, as observed on the previously connected meter, FIG. 5 unit 20.

We claim:

1. Apparatus for testing at a source for proper activation of a line amplifier, comprising:
   a balanced resistance network,
   said network having a double set of connectors for series adding said network between the line amplifier and other equipment or wire pairs.

2. Apparatus according to claim 1, wherein said balanced resistance network provides for local simulation of resistive metallic pair of wires 6.5 miles in length measured at 70 degrees Fahrenheit by assigning a first resistor value (R-1) to one side of said metallic pair, and a second resistor value (R-2) to the other side of said pair, creating a balanced resistance network when connected in series with a suitable test meter.

3. Apparatus as in claim 2 wherein the balanced network is connected in series with the output of a line amplifier and the input to a test meter with milliampere indicating capability.

4. Apparatus as in claim 2 wherein the value of the first and second resistors is 600 ohms each and the balanced network is 1200 ohms.

5. A method of testing at a source for proper line amplifier activation by the steps of:
   (a) connecting the input of a balanced resistance network which simulates the resistance of a metallic pair to the input of a line amplifier,
   (b) connecting the output of said network to a current measuring device,
   (c) observing a reference reading on said measuring device,
   (d) connecting the input to said network to the output of the line amplifier,
   (e) observing the indication on said measuring device,
   (f) comparing the indication with said reference reading to determine if proper or improper line amplifier activation has taken place.

6. A method as in claim 5 wherein said measuring device is a test meter with milliampere capability.

7. A method of testing a communication line having an amplifier connected to it, supplying electrical current to said line to determine whether or not said amplifier is providing the proper current output at a point a predetermined distance from said amplifier the steps of;
   (a) providing a load resistance equal to the resistance of said line at a predetermined distance from said amplifier.
   (b) connecting said load in series with said amplifier and measuring the current on the side of said load remote from said amplifier,
   (c) measuring said current output from said supply directly to said amplifier, and
   (d) comparing the difference between said output of said amplifier and the output of said line whereby the function of said amplifier is determined.

* * * * *